(12) United States Patent
Xu et al.

(10) Patent No.: US 11,339,790 B2
(45) Date of Patent: May 24, 2022

(54) HEAT DISSIPATION DEVICE

(71) Applicant: VAST GLORY ELECTRONICS & HARDWARE & PLASTIC(HUI ZHOU) LTD., Hui Zhou (CN)

(72) Inventors: Shi Man Xu, Hui Zhou (CN); Jiasheng Lai, Hui Zhou (CN); Qiancheng Yue, Hui Zhou (CN)

(73) Assignee: VAST GLORY ELECTRONICS & HARDWARE & PLASTIC(HUI ZHOU) LTD., Hui Zhou (CN)

( * ) Notice: Subject to any disclaimer, the term of this patent is extended or adjusted under 35 U.S.C. 154(b) by 0 days.

(21) Appl. No.: 17/177,584

(22) Filed: Feb. 17, 2021

(65) Prior Publication Data

US 2022/0128058 A1    Apr. 28, 2022

(30) Foreign Application Priority Data

Oct. 28, 2020    (CN) .......................... 202011174905.2

(51) Int. Cl.
| | |
|---|---|
| *F04D 29/05* | (2006.01) |
| *F04D 19/00* | (2006.01) |
| *F04D 29/056* | (2006.01) |
| *H05K 7/20* | (2006.01) |
| *H02K 7/14* | (2006.01) |

(52) U.S. Cl.
CPC ......... *F04D 19/002* (2013.01); *F04D 29/056* (2013.01); *H02K 7/14* (2013.01); *H05K 7/20172* (2013.01)

(58) Field of Classification Search
CPC ....... F04D 19/002; F04D 29/056; H02K 7/14; H05K 7/20172
See application file for complete search history.

(56) References Cited

U.S. PATENT DOCUMENTS

| 7,183,939 | B1 * | 2/2007 | Lo ........................... G09F 13/04 |
| | | | 362/540 |
| 10,364,817 | B2 * | 7/2019 | Chen ....................... F04D 25/08 |
| 10,429,059 | B1 * | 10/2019 | Chen ................... F21V 33/0092 |
| 2006/0133920 | A1 * | 6/2006 | Chen ..................... F04D 29/005 |
| | | | 415/76 |
| 2007/0248476 | A1 * | 10/2007 | Lewis ................. F04D 25/0613 |
| | | | 417/423.1 |

(Continued)

*Primary Examiner* — J. Todd Newton
*Assistant Examiner* — Theodore C Ribadeneyra
(74) *Attorney, Agent, or Firm* — Maschoff Brennan

(57) ABSTRACT

A heat dissipation device including frame, fan rotating assembly, stator assembly, decorative plate and at least two magnetic components. Frame includes base and barrel connected to base. Fan rotating assembly includes hub and a plurality of blades connected to hub. Fan rotating assembly is rotatably disposed on frame via first bearing fan rotating assembly. Stator assembly is disposed on barrel. Hub covers stator assembly. Decorative plate has decorative design and central pillar connected to decorative plate and extending from decorative plate. Central pillar is connected to hub via second bearing. At least two magnetic components are respectively disposed on decorative plate and stator assembly. One of the at least two magnetic components disposed on decorative plate and another one of the at least two magnetic components disposed on stator assembly are attracted to each other so that decorative plate is stationary while fan rotating assembly rotates.

11 Claims, 5 Drawing Sheets

(56) References Cited

U.S. PATENT DOCUMENTS

| | | | |
|---|---|---|---|
| 2009/0238685 A1* | 9/2009 | Santa Ana | F04D 25/12 |
| | | | 415/182.1 |
| 2013/0156616 A1* | 6/2013 | Chang | F04D 29/624 |
| | | | 427/98.8 |
| 2016/0369809 A1* | 12/2016 | Richter | H05K 7/20136 |
| 2018/0163960 A1* | 6/2018 | Lin | F04D 29/005 |
| 2019/0063740 A1* | 2/2019 | Huang | F04D 25/08 |
| 2020/0271131 A1* | 8/2020 | Kim | F04D 29/703 |
| 2020/0291949 A1* | 9/2020 | Kim | F04D 25/064 |
| 2020/0332804 A1* | 10/2020 | Lin | F04D 29/005 |
| 2021/0102547 A1* | 4/2021 | Tsung-Wei | F04D 25/062 |
| 2022/0057080 A1* | 2/2022 | Xu | F21V 33/0096 |

* cited by examiner

HEAT DISSIPATION DEVICE

CROSS-REFERENCE TO RELATED APPLICATIONS

This non-provisional application claims priority under 35 U.S.C. § 119(a) on Patent Application No(s). 202011174905.2 filed in China, on Oct. 28, 2020, the entire contents of which are hereby incorporated by reference.

TECHNICAL FIELD

The disclosure relates to a heat dissipation device, more particularly to a heat dissipation device whose decorative plate is not moved with the fan rotating assembly.

BACKGROUND

As the processing speed and the performance of an electronic device, such as a central processing unit, improves, the heat generated by the electronic devices is increased. The generated heat causes the temperature of the electronic device to be increased, and if the heat is not dissipated to the outside effectively, the reliability of the electronic device will be reduced. In order to prevent the electronic device from overheating, a heat dissipation device, such as a fan, is used to effectively dissipate the heat generated by the electronic device, thereby ensuring the standard operation of the electronic device.

In the fan or other rotating cooling device, a decorative design, such as a brand logo, a design pattern or other patterns, may be printed on the fan blades for the user to recognize the brand or the manufacturer of the fan device, but it will rotate with the fan blades while the fan is in operation, resulting in the decorative design difficult to be recognized by the user.

In the prior art, a stationary decorative design is proposed. However, in practical, the structure configured to make the decorative design stationary is complicated. Such structure usually includes a plurality of components that are radially stacked to one another to be formed as a single piece, but such structure is not stable. In particular, the heat dissipation device including complicated structure is not suitable for the thin electronic devices. Therefore, a heat dissipation device that can overcome the aforementioned defects should be provided.

SUMMARY

The disclosure provides a heat dissipation device adopting relatively simple structure for keeping the decorative design stationary.

One embodiment of this disclosure provides a heat dissipation device including a frame, a fan rotating assembly, a stator assembly, a decorative plate and at least two magnetic components. The frame includes a base and a barrel connected to the base. The fan rotating assembly includes a hub and a plurality of blades connected to the hub. The fan rotating assembly is rotatably disposed on the frame via a first bearing fan rotating assembly. The stator assembly is disposed on the barrel. The hub covers the stator assembly. The decorative plate has a decorative design and a central pillar connected to the decorative plate and extending from the decorative plate. The central pillar is connected to the hub via a second bearing. The at least two magnetic components are respectively disposed on the decorative plate and the stator assembly. One of the at least two magnetic components disposed on the decorative plate and another one of the at least two magnetic components disposed on the stator assembly are attracted to each other so that the decorative plate is stationary while the fan rotating assembly rotates.

According a heat dissipation device provided by an embodiment of the disclosure, the fan rotating assembly further comprises a pillar. The pillar is at least partially disposed in the barrel. One end of the pillar is connected to the hub, and another end of the pillar rests on the base. The first bearing is sleeved on the pillar.

According a heat dissipation device provided by an embodiment of the disclosure, the hub includes a cover plate and an annular outer side plate. The cover plate has a stepped part. The second bearing is disposed on the stepped part. An end of the central pillar is connected to the decorative plate, and another end of the central pillar rests on a bottom part of the stepped part. The annular outer side plate is connected to the cover plate, and the plurality of blades are connected to the annular outer side plate.

According a heat dissipation device provided by an embodiment of the disclosure, the hub further includes an annular side plate. The annular side plate is connected to the bottom part of the stepped part. The annular side plate is partially located inside the barrel. An end of the pillar extends into and is connected to the annular side plate.

According a heat dissipation device provided by an embodiment of the disclosure, the decorative design is disposed on a top surface of the decorative plate. The bottom surface of the decorative plate has an accommodation space that is aligned with the at least two magnetic components, and the at least two magnetic components is disposed in the accommodation space.

According a heat dissipation device provided by an embodiment of the disclosure, a center part of a bottom surface of the decorative plate has an insertion hole, and an end of the central pillar is connected to the insertion hole.

According a heat dissipation device provided by an embodiment of the disclosure. the decorative plate and the central pillar are integrally formed as a single piece.

According a heat dissipation device provided by an embodiment of the disclosure, the decorative plate and the central pillar are independently formed as two pieces and the decorative plate is connected to the central pillar.

According a heat dissipation device provided by an embodiment of the disclosure, the first bearing and/or the second bearing are/is sleeve bearing(s).

According a heat dissipation device provided by an embodiment of the disclosure, the central pillar and a center of the pillar are located at an axial line.

One embodiment of the disclosure provides a heat dissipation device including a frame, a fan rotating assembly, a stator assembly, a decorative plate and at least two magnetic components. The frame includes a base and a barrel. The barrel is connected to the base. The fan rotating assembly includes a hub and a plurality of blades. The plurality of blades are connected to the hub, and the fan rotating assembly is rotatably disposed on the frame via a first bearing fan rotating assembly. The stator assembly is disposed on the barrel, and the hub covers the stator assembly. The decorative plate has a decorative design and a central pillar. The central pillar is connected to the decorative plate and extends from the decorative plate, and the central pillar is connected to the hub via a second bearing. The at least two magnetic components are respectively disposed on the decorative plate and the stator assembly. One of the at least two magnetic components disposed on the decorative plate and another one of the at least two magnetic components disposed on the stator assembly are attracted to each other so that the decorative plate is stationary while the fan rotating assembly rotates. At least one of the at least two magnetic components is made of magnetite and another one of the at least two magnetic components is made of any one of magnetite, metal, magnetic composite material or any combination thereof.

According to the heat dissipation device discussed by the above embodiments, the decorative plate is fixed on the stationary central pillar rather than on the rotatable hub, such that the decorative plate having the decorative design remains stationary while the blades rotate relative to the frame, thereby allowing the decorative design on the decorative plate to be clearly recognized by the user. Meanwhile, the decorative plate in this disclosure may be fixed at a certain or a random angle. Thus, the information of the brand may thus be better publicized. Also, the adoption of the sleeve bearing reduces the structural complexity of the heat dissipation device and reduce the noise generated during the operation of the heat dissipation device.

The summary and the following detail descriptions of the disclosure are used to demonstrate and explain the principle of the disclosure and provide a further explanation of the claims.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
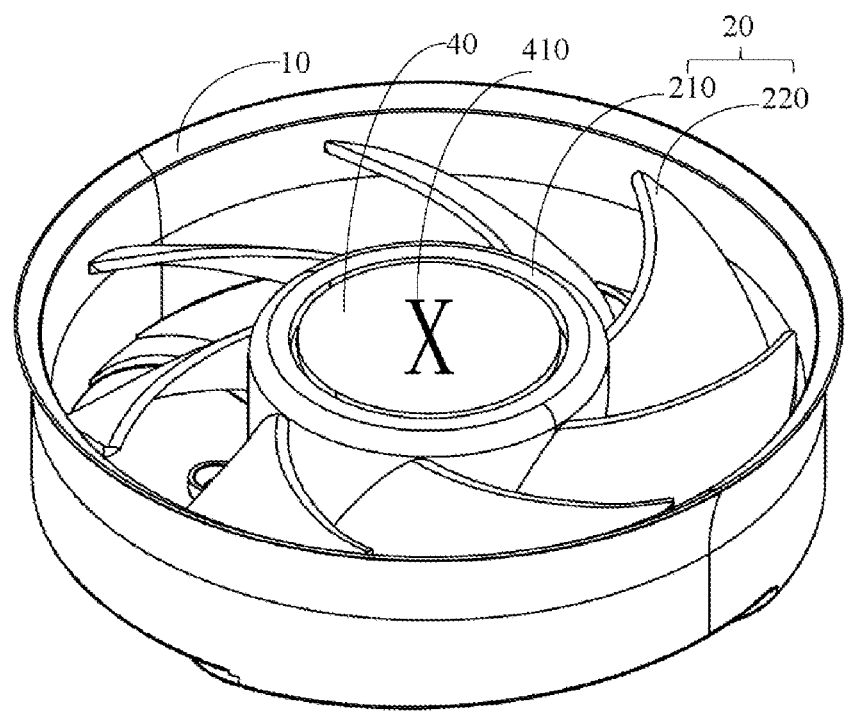
FIG. 1 is a perspective view of a heat dissipation device according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

To make the objectives, technical solution and effect of the disclosure clear, the technical solution of the embodiments of the disclosure are described in a clear and complete manner together with the drawing. Apparently, the embodiments are partial embodiments of the disclosure but not all of the embodiments. According to the embodiments of the disclosure, all the other embodiments made by a person skilled in the art that are not involved an inventive step are within the scope of the disclosure.

The embodiments of the disclosure are exemplary but not limiting. Additionally, components/elements using the same or similar reference in the drawings and detailed descriptions denote the same or similar part.

In this disclosure, terms used to describe directions, such as "top", "bottom", "left", "right", "front" and "rear", are merely the directions in the drawing. Thus, the disclosure is not limited by those terms.

In this disclosure, the terms, such as "include", "comprise", "have" and "contain", are open transitions and means "include but not limited to".

In this disclosure, the term "and/or" include any or all combinations of objects.

In this disclosure, terms "a plurality" includes "two" and "more than two"; in this disclosure, terms "a plurality groups of" includes "two groups of" and "more than two groups of".

Some terms used to describe the disclosure are discussed hereinafter or other paragraphs in this specification to provide additional guidance with respect to the descriptions of the disclosure to a person skilled in the art.

Figure 2:
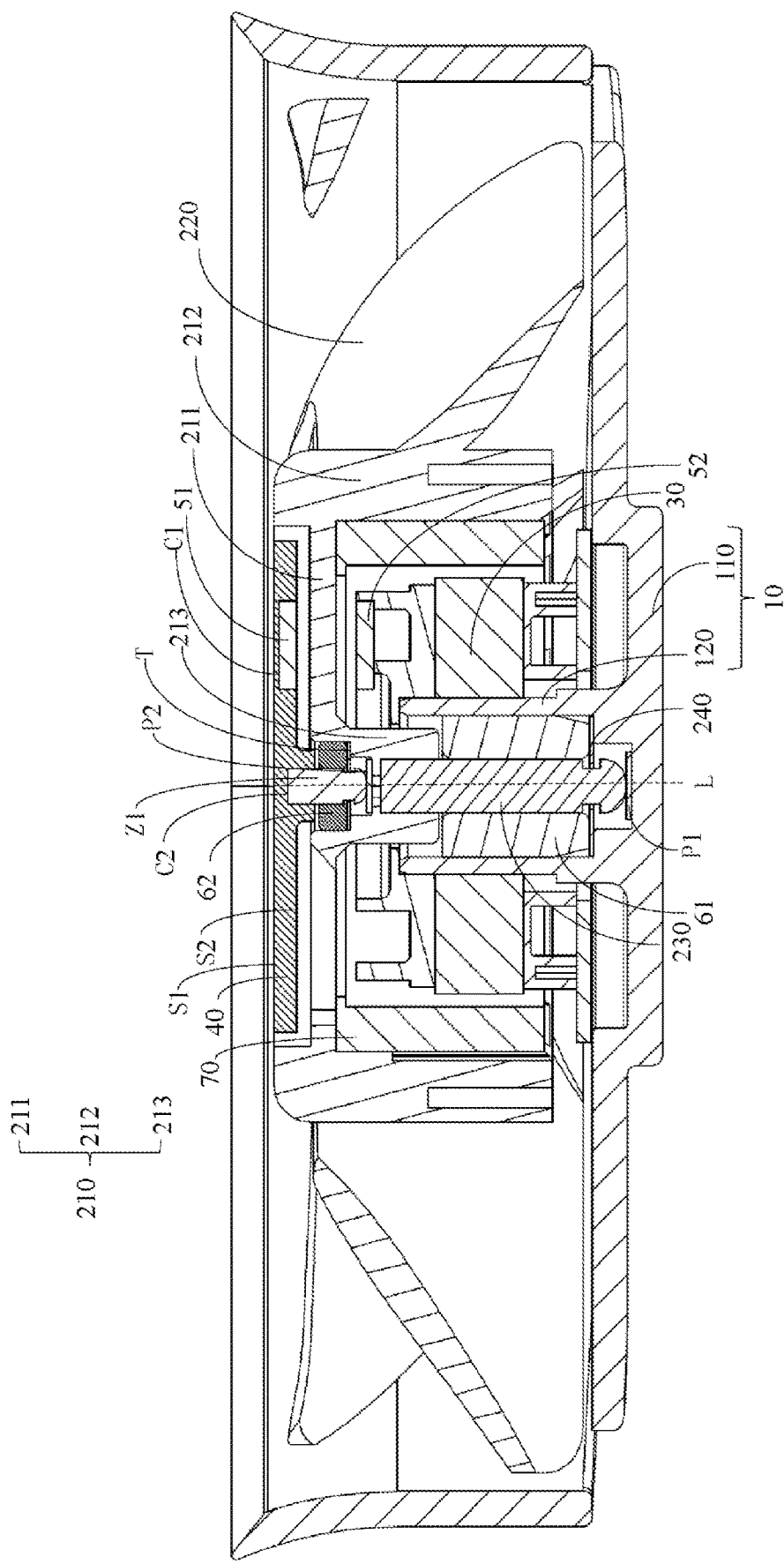
FIG. 2 is a cross-sectional view of the heat dissipation device.

Please refer to FIG. 1 and FIG. 2, where FIG. 1 is a perspective view of a heat dissipation device according to the disclosure, and FIG. 2 is a cross-sectional view of the heat dissipation device. As shown in FIG. 1 and FIG. 2, the heat dissipation device provided by the disclosure includes a frame 10, a fan rotating assembly 20, a stator assembly 30, a decorative plate 40, two magnetic components 51 and 52 and a magnetic ring 70. The frame 10 includes a base 110 and a barrel 120. The barrel 120 is connected to the base 110. The fan rotating assembly 20 includes a hub 210 and a plurality of blades 220. The blades 220 are connected to the hub 210. The fan rotating assembly 20 is rotatably disposed on the frame 10 via the first bearing 61. The stator assembly 30 is disposed on the barrel 120. The magnetic ring 70 is disposed outside the stator assembly 30. The hub 210 covers the stator assembly 30 and the magnetic ring 70. The decorative plate 40 has a decorative design 410 and a central pillar Z1 that is connected to the decorative plate 40 and extends from the decorative plate 40. The central pillar Z1 is connected to the hub 210 via the second bearing 62. The two magnetic components 51 and 52 are disposed on the decorative plate 40 and the stator assembly 30, respectively. Specifically, the magnetic component 51 is disposed on the decorative plate 40. The magnetic component 52 is disposed on the stator assembly 30. The two magnetic components 51 and 52 are attracted to each other, such that the decorative plate 40 is stationary while the fan rotating assembly 20 rotates. During the operation of the heat dissipation device provided by the disclosure, the decorative plate can remain stationary, such that a user is able to clearly recognize the decorative design on the decorative plate.

The decorative plate 40 and the central pillar Z1 are stationary relative to the fan rotating assembly 20. The decorative plate 40 can be connected to the central pillar Z1 via various bonding means, such as nuts and bolts, screws, pins, rivets, anchors, sewing, pressing and bending, hasp, shrink-fitting, magnetic attraction, engaging, any combination thereof or other similar means. The decorative plate 40 has the decorative design 410. The decorative design 410 is light-permeable.

The decorative plate 40 is made of light-permeable material, such as transparent material or translucent material. Such transparent or translucent material includes Acrylic, glass or plastic and so on, and the decorative design 410 is formed by a spray painting process. In short, during the spray painting process, a mask including the pattern of the decorative design 410 is disposed on the decorative plate 40, and there is a part of the decorative plate 40 not covered by such pattern. Then, a paint is sprayed on the uncovered part of the decorative plate 40, thereby making the uncovered part become opaque. In an embodiment, as shown, the shape of the decorative design 410 is for example, a letter "X", but the disclosure is not limited thereto. In other embodiments, the decorative design may be a brand name, brand logo or any other desired design.

The magnetic component 52 may be fixed on the stator assembly 30 via gluing, overmolding, screwing, riveting, hot melting, or welding.

In an embodiment, the blades 220 are in a curved shape or in an arch (or arcuate) shape that reversely faces the rotation direction of the blades 220.

In an embodiment of the disclosure, the magnetic ring 70 may be a ring structure of single piece disposed outside the stator assembly 30. In another embodiment of the disclosure, the magnetic ring 70 may be two semi-circular structures disposed outside the stator assembly 30.

Figure 6:
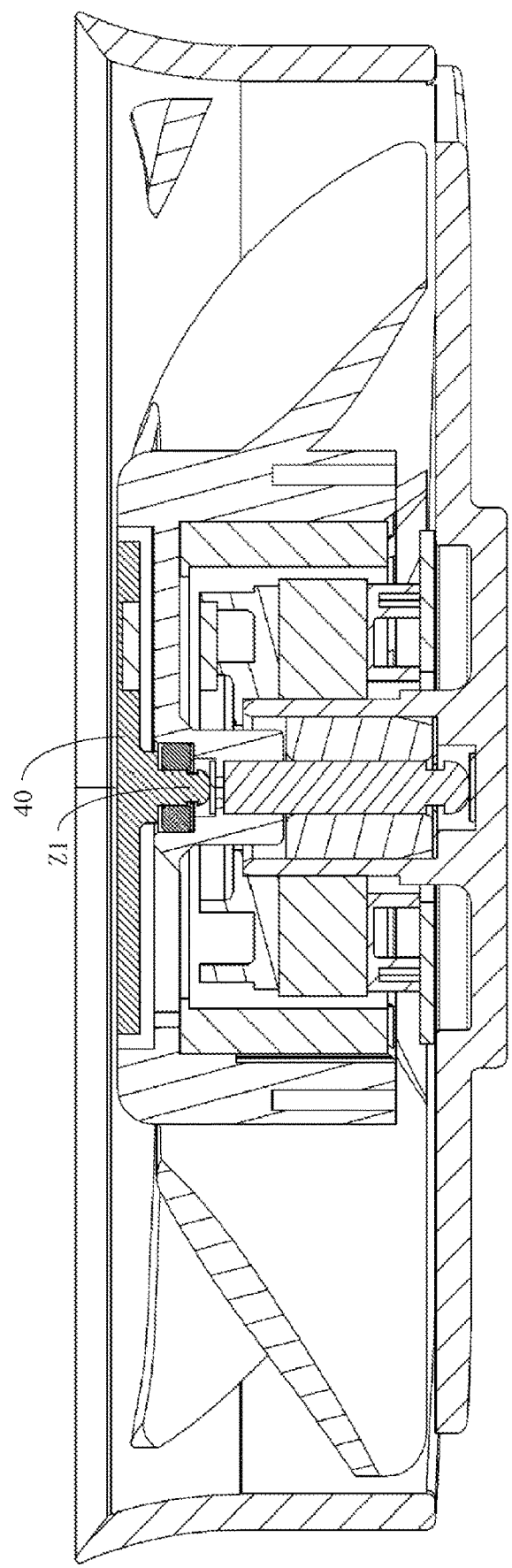
FIG. 6 is a cross-sectional view of a heat dissipation device according to another embodiment.

Note that, in this embodiment, as shown in FIG. 2, the decorative plate 40 and the central pillar Z1 are two pieces that are independent and connected to each other, but the disclosure is not limited thereto. In other embodiments of the disclosure, as shown in FIG. 6, the decorative plate 40 and the central pillar Z1 are integrally formed as a single piece.

In some embodiments, the two magnetic components are made of magnetite. In some embodiments, one of the two magnetic components is made of magnetite and the other one is made of one of magnetite, metal and magnetic composite material. Note that, in some embodiments, when there are more than two magnetic components, one of the magnetic components is made of magnetite and the others may be made of one of magnetite, metal, and magnetic composite material or any combination thereof. For example, when there are three magnetic components, one of the magnetic components is made of magnetite, and the others may be made of the same material (e.g., magnetite, metal or magnetic composite material) or different materials (e.g., one may be made of magnetite and the other is made of metal or magnetic composite material). The disclosure is not limited to the aforementioned examples, as long as any idea uses the magnetic attraction of the magnetic component to maintain the decorative plate to be stationary, they are within the scope of the appending claims of the disclosure.

In some embodiments, the central pillar Z1 is made of light-permeable material, such as Acrylic, glass and plastic. However, in other embodiments, the central pillar Z1 is made of opaque material. The central pillar Z1 is connected to the decorative plate 40 via various bonding means, such as nuts and bolts, screws, pins, rivets, anchors, sewing, pressing and bending, hasp, shrink-fitting, magnetic attraction, press-fit, adhesion, any combination thereof or similar means.

Note that, although there are two magnetic components in this embodiment, but the disclosure is not limited thereto. The quantity of the magnetic component may be modified by the designer according to the actual requirements.

Further, the fan rotating assembly 20 further includes a pillar 230. The pillar 230 is at least partially disposed in the barrel 120, and an end of the pillar 230 is connected to the hub 210. The other end of the pillar 230 rests on the base 110. The first bearing 61 is sleeved on the pillar 230. In this embodiment, a buckle ring 240 is further sleeved on the pillar 230. The buckle ring 240 is located between the first bearing 61 and the base 110. The other end of the pillar 230 rests on the buckle ring 240.

In this embodiment, a first anti-friction pad P1 is disposed on the base 110. The other end of the pillar 230 rests on the first anti-friction pad P1.

Figure 3:
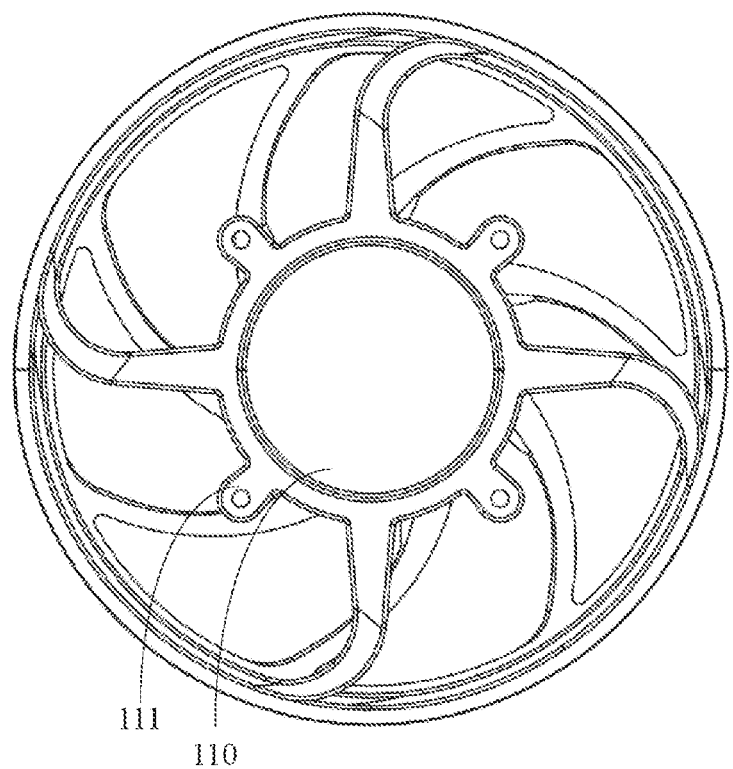
FIG. 3 is a bottom view of the heat dissipation device.

Please refer to FIG. 3, there is shown a bottom view of the heat dissipation device. As shown in FIG. 3, a plurality of fixing parts 111 are disposed on outer edge of the base 110 and are spaced apart from one another. The fixing parts 111 are configured for the penetration of screws for the fixation of the heat dissipation device on an apparatus, such as an electronic device. The fixing parts and the base 110 may be integrally formed as a single piece.

Figure 4:
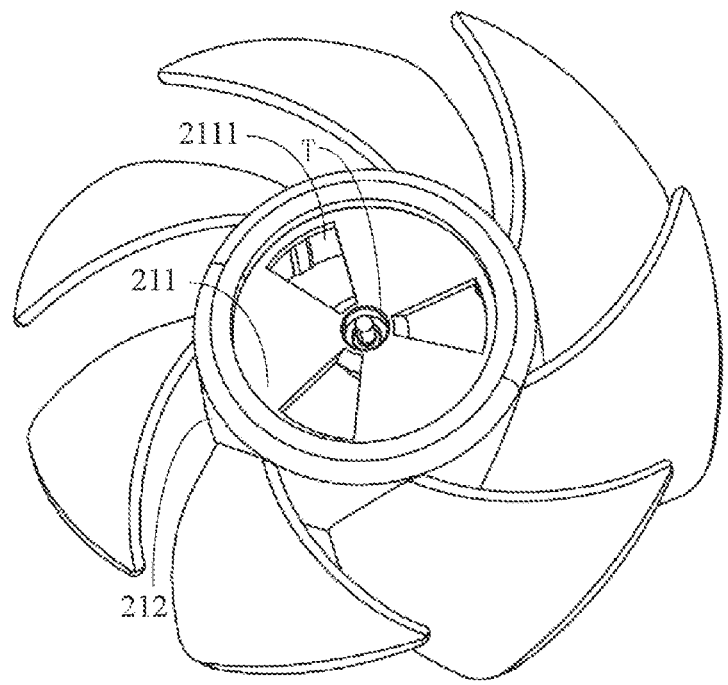
FIG. 4 is a perspective view of a hub from a viewing angle.
Figure 5:
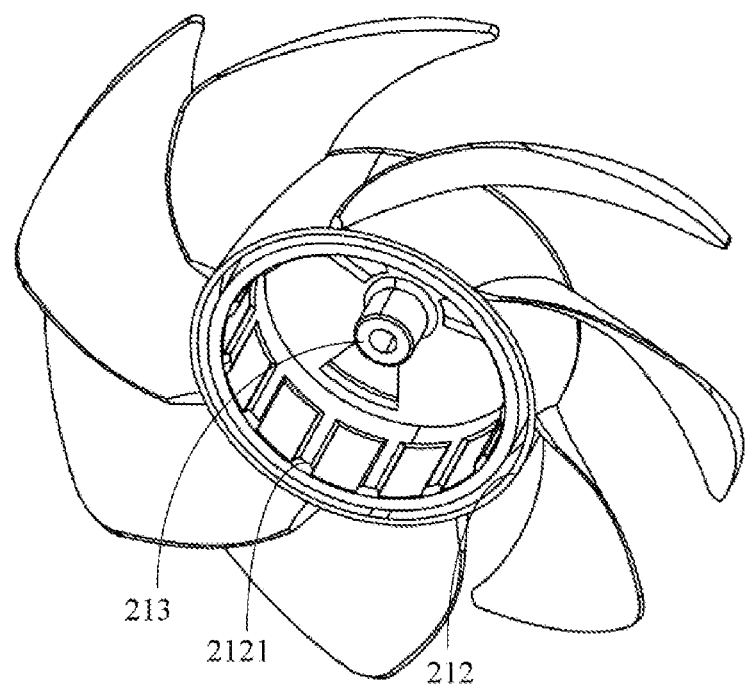
FIG. 5 is another perspective view of the hub from another viewing angle.

Moreover, please refer to FIG. 4 and FIG. 5, where FIG. 4 is a perspective view of a hub from a viewing angle, and FIG. 5 is another perspective view of the hub from another viewing angle. The hub 210 includes a cover plate 211 and an annular outer side plate 212. A plurality of openings 2111 are formed on the cover plate 211 and are spaced apart from one another. A stepped part T is formed on and extends from a center part of the cover plate 211. The second bearing 62 is disposed on the stepped part T. An end of the central pillar Z1 is connected to the decorative plate 40. The other end of the central pillar Z1 rests on the bottom of the stepped part T. The annular outer side plate 212 is connected to the cover plate 211. A plurality of protrusions 2121 are disposed inside the annular outer side plate 212 and are spaced apart from one another. The blades 220 are connected to the annular outer side plate 212 and radially extend from an outer surface of the annular outer side plate 212.

In this embodiment, a second anti-friction pad P2 is disposed on the bottom of the stepped part T. The other end of the central pillar Z1 rests on the second anti-friction pad P2.

The hub 210 further includes an annular side plate 213. The annular side plate 213 is connected to a bottom part of the stepped part T. The annular side plate 213 is partially located inside the barrel 120. An end of the pillar 230 extends into and is connected to the annular side plate 213.

Furthermore, the decorative design 410 is located on a top surface S1 of the decorative plate 40. An accommodation space C1 is formed at a bottom surface S2 of the decorative plate 40 and is aligned with the magnetic components. The magnetic components are disposed in the accommodation space C1. A central part of the bottom surface of the decorative plate 40 has an insertion hole C2. One end of the central pillar Z1 is connected to the insertion hole C2.

In other embodiments, the magnetic component 51 may be fixed on the bottom surface S2 of the decorative plate 40 via gluing, overmolding, screwing, riveting, hot melting, or welding.

In this embodiment, it is preferable that the centers of the pillar 230 and the central pillar Z1 are located at the same axial line L; that is, the central pillar Z1 and the pillar 230 are coaxial, but the disclosure is not limited thereto.

In addition, in this disclosure, the first bearing 61 and/or the second bearing 62 are/is sleeve bearing(s).

In other embodiments of the disclosure, the heat dissipation device may further include a light-emitting assembly. The light-emitting assembly includes a circuit board and a plurality of light sources. The circuit board is stacked on the stator assembly 30 so as to be indirectly disposed on the frame 10 via the stator assembly 30. The light sources are located in the hub 210 and located below the cover plate 211. The light sources are, for example, light-emitting diodes. The light emitted by the light sources of the light-emitting assembly is configured to light up the decorative design 410 of the decorative plate 40.

In other embodiments of the disclosure, the fan rotating assembly 20 is also made of light-permeable material, such as Acrylic, glass, plastic or the like. The hub 210 is processed by spray painting so as to be opaque, and the blades 220 are not processed by spray painting so as to be light-permeable.

According to the heat dissipation device discussed by the above embodiments, the decorative plate is fixed on the stationary central pillar rather than on the rotatable hub, such that the decorative plate having the decorative design remains stationary while the blades rotate relative to the frame, thereby allowing the decorative design on the decorative plate to be clearly recognized by the user. Meanwhile, the decorative plate in this disclosure may be fixed at a certain or a random angle. Thus, the information of the brand may thus be better publicized. Also, the adoption of the sleeve bearing reduces the structural complexity of the heat dissipation device and reduce the noise generated during the operation of the heat dissipation device.

Although the disclosure is described by the above embodiments, they are not intended to limit the disclosure. A person skill in the art can make some modifications and variations without departing from the spirit and scope of the disclosure, and thus the scope of the disclosure indicated by the following claims.

What is claimed is:

1. A heat dissipation device, comprising:
    a frame, comprising a base and a barrel connected to the base;
    a fan rotating assembly, comprising a hub and a plurality of blades connected to the hub, wherein the fan rotating assembly is rotatably disposed on the frame via a first bearing;
    a stator assembly, disposed on the barrel, wherein the hub covers the stator assembly;
    a decorative plate, having a decorative design and a central pillar connected to the decorative plate and extending from the decorative plate, wherein the central pillar is connected to the hub via a second bearing; and
    at least two magnetic components, respectively disposed on the decorative plate and the stator assembly, wherein one of the at least two magnetic components disposed on the decorative plate and another one of the at least two magnetic components disposed on the stator assembly are attracted to each other so that the decorative plate is stationary while the fan rotating assembly rotates.

2. The heat dissipation device according to claim 1, wherein the fan rotating assembly further comprises a pillar, the pillar is at least partially disposed in the barrel, one end of the pillar is connected to the hub, another end of the pillar rests on the base, and the first bearing is sleeved on the pillar.

3. The heat dissipation device according to claim 2, wherein the hub comprises:
    a cover plate, having a stepped part, wherein the second bearing is disposed on the stepped part, an end of the central pillar is connected to the decorative plate, and another end of the central pillar rests on a bottom part of the stepped part; and
    an annular outer side plate, connected to the cover plate, and the plurality of blades connected to the annular outer side plate.

4. The heat dissipation device according to claim 3, wherein the hub further comprises an annular side plate, the annular side plate is connected to the bottom part of the stepped part, the annular side plate is partially located inside the barrel, and an end of the pillar extends into and is connected to the annular side plate.

5. The heat dissipation device according to claim 3, wherein the decorative design is disposed on a top surface of the decorative plate, a bottom surface of the decorative plate has an accommodation space that is aligned with the at least two magnetic components, and the at least two magnetic components is disposed in the accommodation space.

6. The heat dissipation device according to claim 3, wherein a center part of a bottom surface of the decorative plate has an insertion hole, and an end of the central pillar is connected to the insertion hole.

7. The heat dissipation device according to claim 1, wherein the decorative plate and the central pillar are integrally formed as a single piece.

8. The heat dissipation device according to claim 1, wherein the decorative plate and the central pillar are independently formed as two pieces and the decorative plate is connected to the central pillar.

9. The heat dissipation device according to claim 1, wherein the first bearing and/or the second bearing are/is sleeve bearing(s).

10. The heat dissipation device according to claim 2, wherein the central pillar and a center of the pillar are located at an axial line.

11. A heat dissipation device, comprising:
    a frame, comprising a base and a barrel connected to the base;
    a fan rotating assembly, comprising a hub and a plurality of blades connected to the hub, wherein the fan rotating assembly is rotatably disposed on the frame via a first bearing;
    a stator assembly, disposed on the barrel, wherein the hub covers the stator assembly;
    a decorative plate, having a decorative design and a central pillar connected to the decorative plate and extending from the decorative plate, wherein the central pillar is connected to the hub via a second bearing; and
    at least two magnetic components, respectively disposed on the decorative plate and the stator assembly, wherein one of the at least two magnetic components disposed on the decorative plate and another one of the at least two magnetic components disposed on the stator assembly are attracted to each other so that the decorative plate is stationary while the fan rotating assembly rotates;
    wherein, at least one of the at least two magnetic components is made of magnetite and another of the at least two magnetic components is made of any one of magnetite, metal, magnetic composite material or any combination thereof.

* * * * *